(12) United States Patent
Chang et al.

(10) Patent No.: US 9,941,129 B2
(45) Date of Patent: Apr. 10, 2018

(54) SEMICONDUCTOR DEVICE HAVING SELF-ALIGNED GATE CONTACTS

(71) Applicant: International Business Machines Corporation, Armonk, NY (US)

(72) Inventors: Josephine B. Chang, Mahopac, NY (US); Paul Chang, Mahopac, NY (US); Michael A. Guillorn, Yorktown Heights, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 15/183,278

(22) Filed: Jun. 15, 2016

(65) Prior Publication Data
US 2016/0300762 A1     Oct. 13, 2016

Related U.S. Application Data

(62) Division of application No. 14/585,381, filed on Dec. 30, 2014, now Pat. No. 9,484,205.

(Continued)

(51) Int. Cl.
*H01L 21/28*      (2006.01)
*H01L 21/283*     (2006.01)
(Continued)

(52) U.S. Cl.
CPC ...... *H01L 21/283* (2013.01); *H01L 21/76837* (2013.01); *H01L 21/76897* (2013.01);
(Continued)

(58) Field of Classification Search
CPC ............. H01L 21/283; H01L 21/76837; H01L 21/76897; H01L 21/823418;
(Continued)

(56) References Cited

U.S. PATENT DOCUMENTS

2005/0208762 A1* 9/2005 Chen ................. H01L 21/28518
                                              438/649
2005/0245100 A1* 11/2005 Wu .................... H01L 21/02126
                                              438/790

(Continued)

OTHER PUBLICATIONS

List of IBM Patents or Patent Applications Treated As Related—Date Filed: Jul. 28, 2016; 2 pages.

*Primary Examiner* — Jesse Y Miyoshi
*Assistant Examiner* — David Spalla
(74) *Attorney, Agent, or Firm* — Cantor Colburn LLP; Vazken Alexanian

(57) ABSTRACT

A semiconductor device and a method for manufacturing the device. The method includes: depositing a first dielectric layer on a semiconductor device; forming a plurality of first trenches through the first dielectric layer; depositing an insulating fill in the plurality of first trenches; planarizing the plurality of first trenches; forming a first gate contact between the plurality of first trenches; depositing a first contact fill in the first gate contact; planarizing the first gate contact; depositing a second dielectric layer on the device; forming a plurality of second trenches through the first and second dielectric layers; depositing a conductive fill in the plurality of second trenches; planarizing the plurality of second trenches; forming a second gate contact where the second gate contact is in contact with the first gate contact; depositing a second contact fill in the second gate contact; and planarizing the second gate contact.

20 Claims, 12 Drawing Sheets

Related U.S. Application Data

(60) Provisional application No. 61/976,073, filed on Apr. 7, 2014.

(51) Int. Cl.

| | | |
|---|---|---|
| *H01L 29/417* | (2006.01) | |
| *H01L 29/423* | (2006.01) | |
| *H01L 29/66* | (2006.01) | |
| *H01L 29/78* | (2006.01) | |
| *H01L 21/768* | (2006.01) | |
| *H01L 21/8234* | (2006.01) | |
| *H01L 23/535* | (2006.01) | |
| *H01L 27/088* | (2006.01) | |
| *H01L 29/08* | (2006.01) | |
| *H01L 29/40* | (2006.01) | |

(52) U.S. Cl.
CPC ........ *H01L 21/823418* (2013.01); *H01L 21/823475* (2013.01); *H01L 23/535* (2013.01); *H01L 27/088* (2013.01); *H01L 29/0847* (2013.01); *H01L 29/665* (2013.01); *H01L 29/401* (2013.01)

(58) Field of Classification Search
CPC ........... H01L 21/823475; H01L 29/665; H01L 29/0847; H01L 23/5226; H01L 27/088
See application file for complete search history.

(56) References Cited

U.S. PATENT DOCUMENTS

| | | | |
|---|---|---|---|
| 2008/0054371 A1* | 3/2008 | Beyer | ................ H01L 29/7845 257/384 |
| 2011/0156107 A1* | 6/2011 | Bohr | ................ H01L 21/76831 257/288 |
| 2015/0287603 A1 | 10/2015 | Chang et al. | |

* cited by examiner

SEMICONDUCTOR DEVICE HAVING SELF-ALIGNED GATE CONTACTS

DOMESTIC PRIORITY

This application is a divisional of U.S. application Ser. No. 14/585,381, entitled "SEMICONDUCTOR DEVICE HAVING SELF-ALIGNED GATE CONTACTS," filed Dec. 30, 2014, which claims the benefit of U.S. Provisional Application No. 61/976,073, entitled "SEMICONDUCTOR DEVICE HAVING SELF-ALIGNED GATE CONTACTS," filed Apr. 7, 2014, both of which are incorporated herein by reference in their entirety.

BACKGROUND

The present invention relates to semiconductor devices. More specifically, the present invention relates to a semiconductor device having self-aligned gate contacts over an active area and a method for manufacturing the device.

Field-effect transistors (FETs) are used in many integrated circuit designs, as switches to open and close the circuits. In general, a FET includes a source region and a drain region connected by a channel, and a gate that regulates electron flow through the channel between the source and drain regions.

For years, the continued minimization of metal oxide semiconductor field-effect transistors (MOSFETs) has driven the worldwide semiconductor industry. Access to and operation of semiconductor devices is provided by contacts to the devices. During manufacture or forming of semiconductor devices, it is important to ensure that gate contacts do not short to the source/drain region. To avoid shorting, a gate must be contacted in a field region. This ground rule limits wiring flexibility at the first metal level and increases the footprint of cells which require multiple gate contacts, especially when adjacent gates must be contacted.

SUMMARY

According to a first aspect of the present invention, a method for manufacturing a semiconductor device is provided. The method includes: depositing a first dielectric layer on a semiconductor device having a plurality of gate structures formed on a plurality of active regions, and a plurality of diffusion regions formed alongside the plurality active regions, wherein the plurality of gate structures have a top, a bottom, and two sides, and are encapsulated by an insulating layer on the top and two sides; forming a plurality of first trenches through the first dielectric layer, wherein the plurality of first trenches are formed at a plurality of first locations and expose a first portion of the plurality of diffusion regions; forming silicide on the first portion of the plurality of diffusion regions exposed by the plurality of the first trenches; depositing an insulating material in the plurality of first trenches; planarizing the plurality of first trenches; forming at least one first gate contact through the first dielectric layer and the insulating layer on the top of at least one of the plurality of gate structures, wherein the at least one first gate contact is formed between the plurality of first trenches; depositing a first contact fill in the at least one first gate contact; planarizing the at least one first gate contact; depositing a second dielectric layer on the first dielectric layer, the plurality of filled first trenches, and the at least one filled gate contact; forming a plurality of second trenches through the first and second dielectric layers, wherein the plurality of second trenches are formed at a plurality of second locations and expose a second portion of the plurality of diffusion regions; forming silicide on the second portion of the plurality of diffusion regions exposed by the plurality of second trenches; depositing a conductive material in the plurality of second trenches; planarizing the plurality of second trenches; forming at least one second gate contact through the second dielectric layer, wherein the at least one second gate contact is in contact with the at least one first gate contact; depositing a second contact fill in the at least one second gate contact; and planarizing the at least one second gate contact.

According to another aspect of the present invention, a semiconductor device is provided. The device includes: a first dielectric layer formed over a semiconductor device having a plurality of gate structures formed on a plurality of active regions, and a plurality of diffusion regions formed along side the plurality of active regions, wherein the plurality of gate structures have a top, a bottom, and two sides, and are encapsulated by an insulating layer on the top and two sides; a plurality of first trenches formed at a plurality of first locations through the first dielectric layer to a first portion of the plurality of diffusion regions, wherein silicide is formed on the first portion of the plurality of diffusion regions and the plurality of first trenches are filled with an insulating material; at least one first gate contact formed through the first dielectric layer and the insulating layer on the top at least one of the plurality of gate structures, wherein the at least one first gate contact is filled a first contact fill and formed between the plurality of first trenches; a second dielectric layer deposited on the first dielectric layer, the plurality of first filled trenches, and the at least one filled gate contact; a plurality of second trenches formed at a plurality of second locations through the first and second dielectric layers to a second portion of the plurality of diffusion regions, wherein silicide is formed on the second portion of the plurality of diffusion regions and the plurality of second trenches are filled with a conductive material; and at least one second gate contact through the second dielectric layer, wherein the at least one second gate contact is filled with a second contact fill and is in contact with the at least one first gate contact.

DETAILED DESCRIPTION

Embodiments of the present invention allow gate structures to be contacted over an active region while ensuring that such contacts do not short to the diffusion region or neighboring gate structures.

Figure 1:
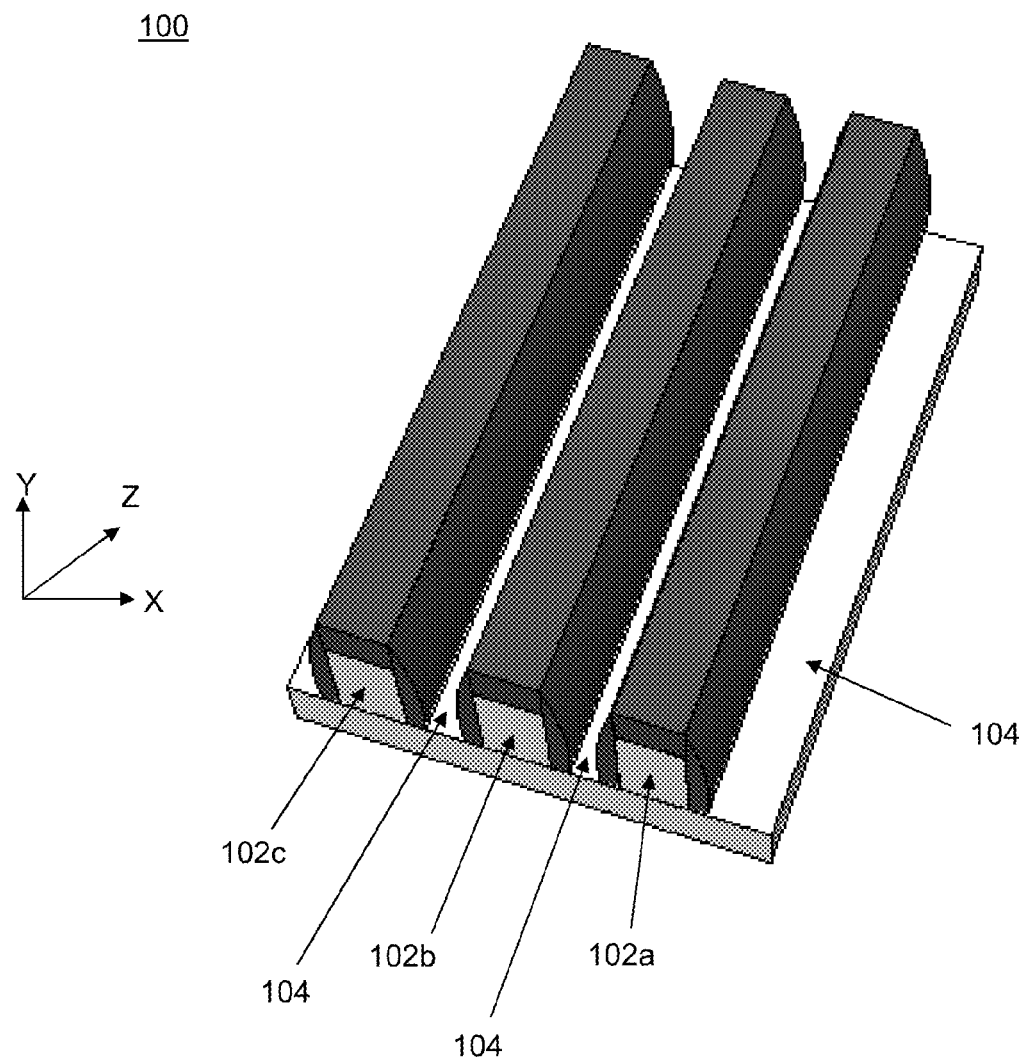
FIG. 1 is a diagram of a generic MOSFET device, according to an embodiment of the present invention.

Referring to FIG. 1, a diagram of a processor 100 is shown. Processor 100 is a generic MOSFET processor that has gate structures 102a, 102b, and 102c, which are formed on active regions. The active regions can be planar, as shown, or they can be fins, nanowires, etc. Diffusion regions 104 are alongside the active regions and between gate structures 102a, 102b, and 102c. Gate structures 102a, 102b, and 102c are, as pictured in FIG. 1, encapsulated by an insulating layer, shown as dark gray, on the top and two sides of the gate structures. According to an embodiment of the present invention, gate structures 102a, 102b, and 102c can be at a pitch of 50 nm-100 nm. However, even smaller pitches can be contemplated.

Figure 2:
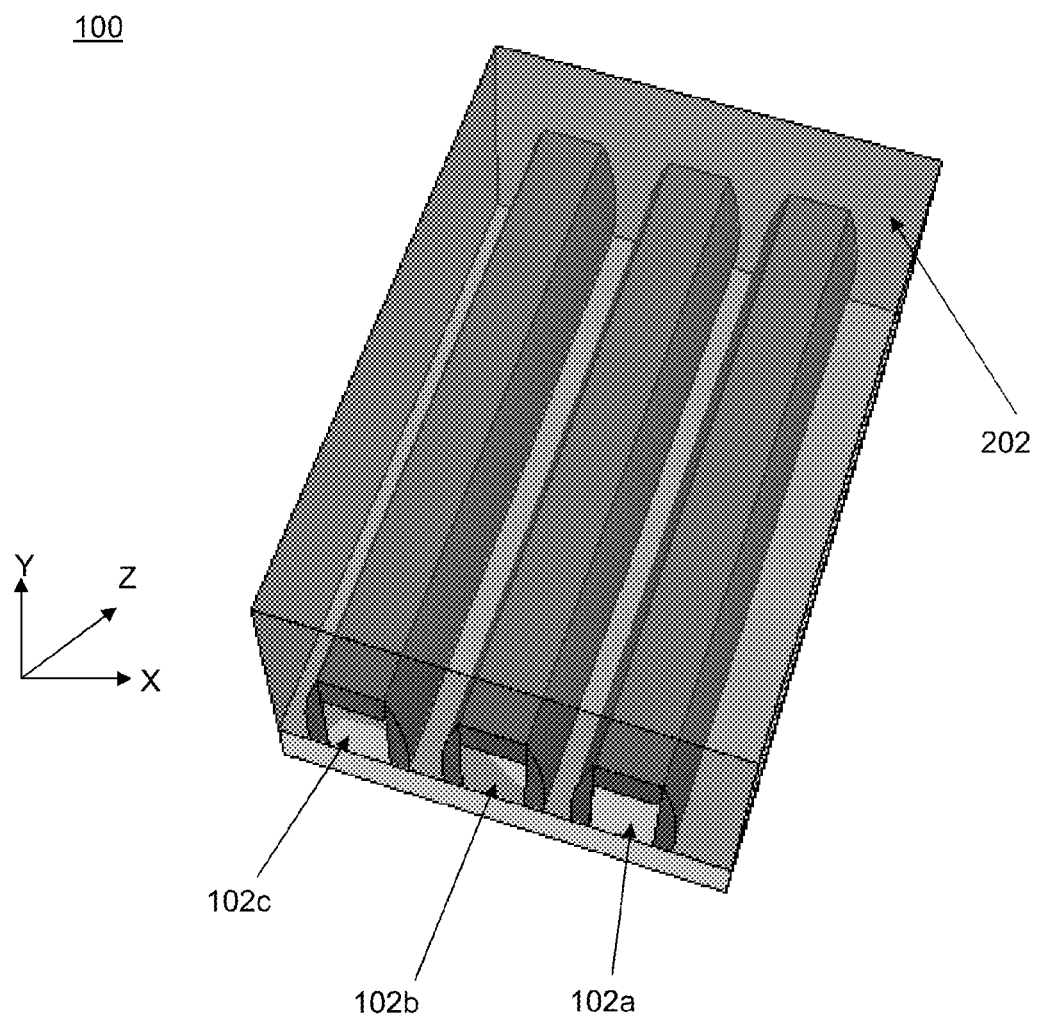
FIG. 2 depicts the device from FIG. 1 following the deposition of a first dielectric layer covering device, according to an embodiment of the present invention.
Figure 12:
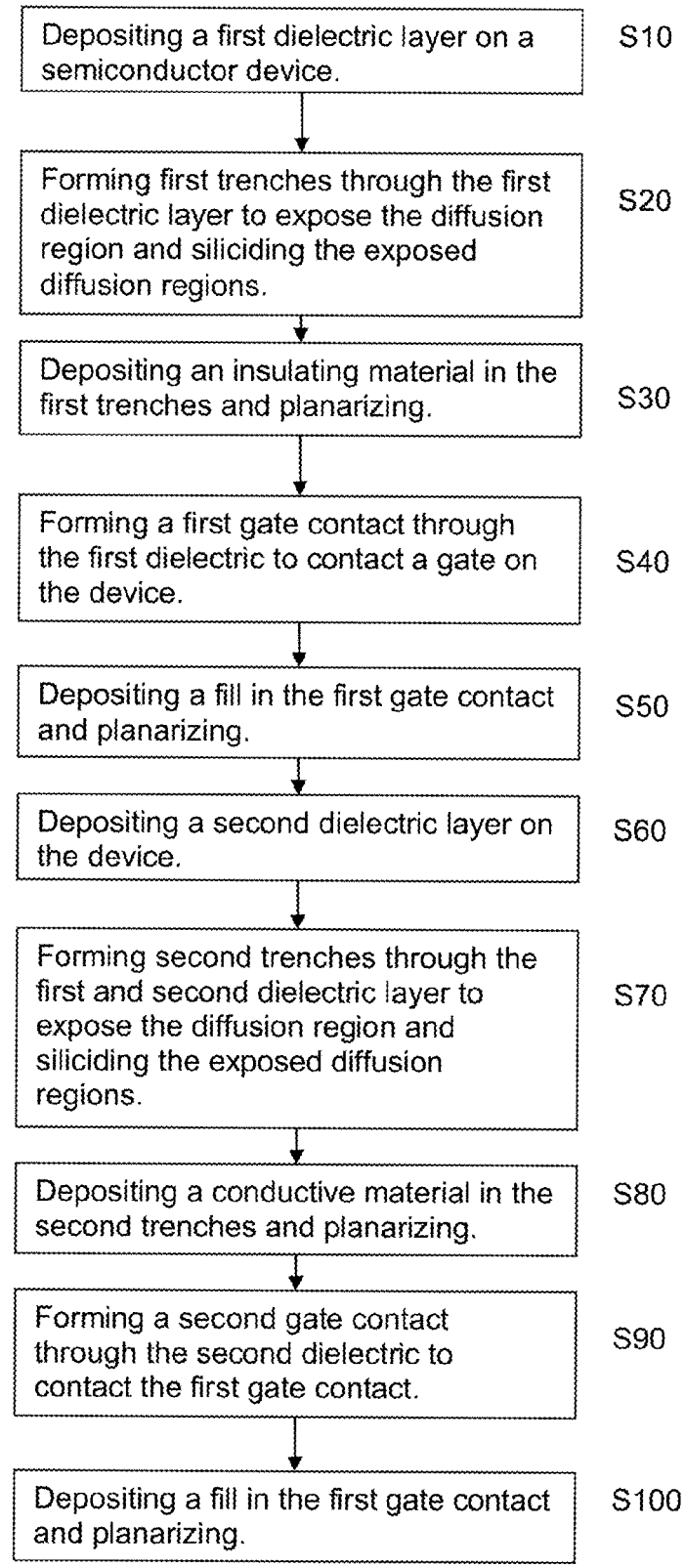
FIG. 12 is a flow chart depicting the operations of the method for fabricating the semiconductor device, according to an embodiment of the present invention.

Referring to FIGS. 2 & 12, processor 100 is depicted after the completion of operation S10. In operation S10, a first dielectric layer 202 is deposited on processor 100. As shown in FIG. 2, diffusion regions 104 and gate structures 102a, 102b, and 102c are covered by first dielectric layer 202. First dielectric layer 202 can include a middle of the line (MOL) dielectric, such as $SiO_2$ or SiCOH.

Figure 3:
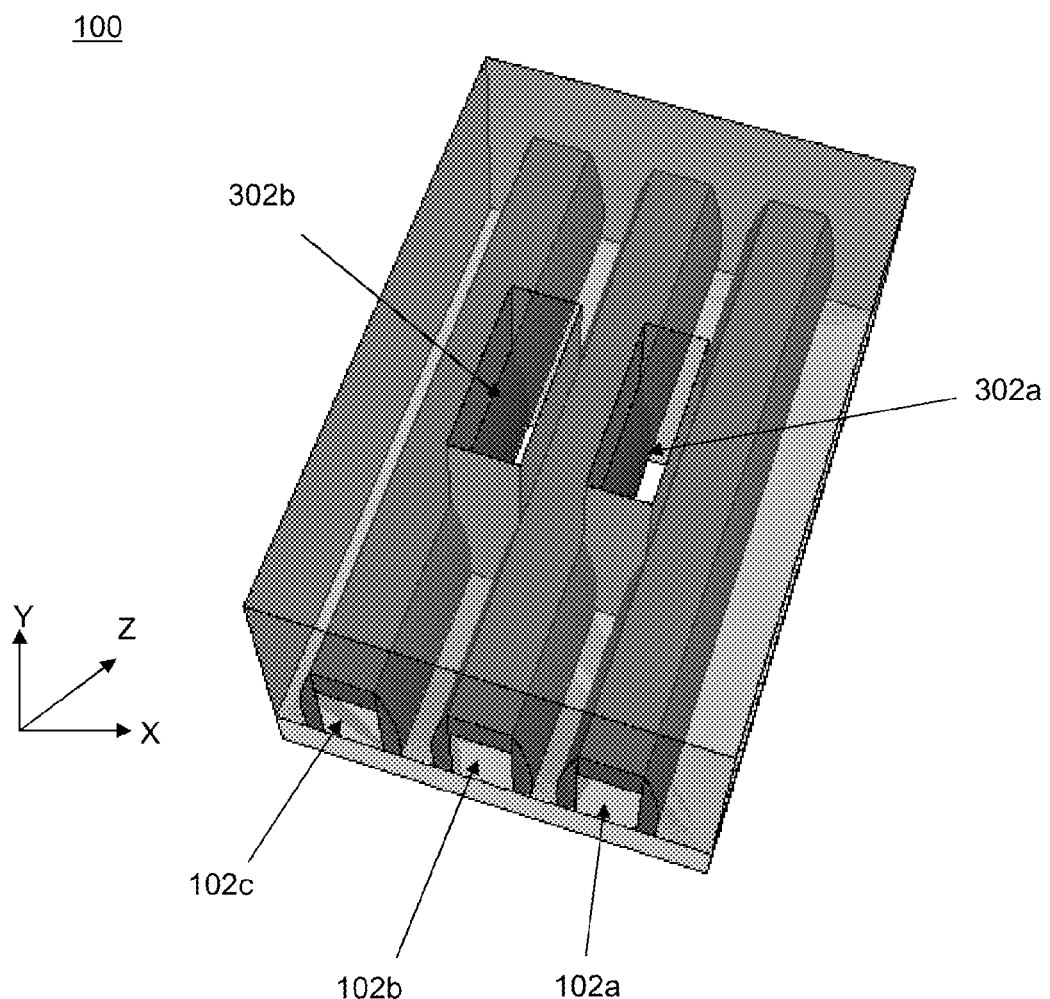
FIG. 3 depicts the device from FIG. 2 after a first set of trenches are formed through the first dielectric layer, according to an embodiment of the present invention.

Referring to FIGS. 3 & 12, processor 100 is shown after operation S20 has been performed. In operation S20, first trenches 302a and 302b are formed through first dielectric layer 202 to expose a portion of diffusion regions 104 between gate structures 102a, 102b, and 102c. As depicted in FIG. 3, first trench 302a exposes a portion of diffusion region 104 that is between gate structures 102a and 102b. First trench 302b exposes a portion of diffusion region 104 that is between gate structures 102b and 102c. Following the formation of first trenches 302a and 302b, silicide is formed on the exposed portions of diffusion region 104 at the bottom of the trenches. The process of forming silicide in such a manner is well known in the art. FIG. 3 depicts first trench 302a between gate structures 102a and 102b, and first trench 302b between gate structures 102b and 102c. First trenches 302a and 302b are depicted as being formed at the midpoint of gate structures 102a, 102b, and 102c. However, the present invention is not limited to this design. The trenches can be formed at any position along the width (z direction) of the gate structures. Further, multiple trenches can be formed between a given pair of gate structures, as opposed to what is shown in FIG. 3, where one trench is formed between the given pair of gate structures.

Figure 4:
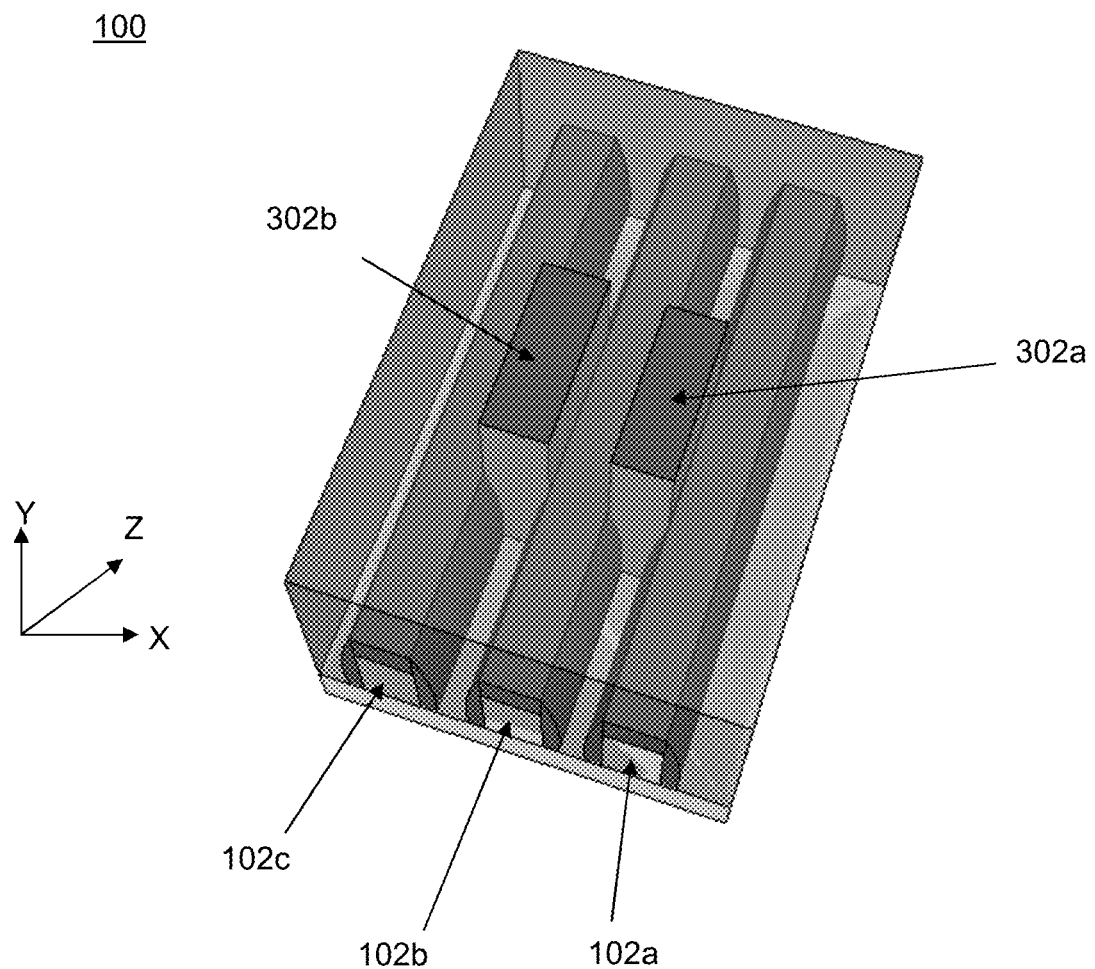
FIG. 4 depicts the device from FIG. 3 after the first set of trenches are filled with an insulating material and planarized, according to an embodiment of the present invention.

Referring to FIGS. 4 & 12, processor 100 is depicted following the completion of operation S30. In operation S30, first trenches 302a and 302b are filled with an insulating material. The insulating material used to fill the trenches can be a dielectric, such as silicon nitride ($Si_3N_4$). The material used in this operation to fill first trenches 302a and 302b is different than the material used in first dielectric layer 202. The process performed in operations S20 and S30 is a standard trench contact module, know by those skilled in the art, but with one difference. The only difference is that in operation S30, an insulating material is used as a fill instead of a metal that would be used in the standard trench contact module. After the trenches are filled with the insulating material, an etch back or polish of the trenches is performed. Following the etch back or polish of first trenches 302a and 302b, processor 100 is planarized.

Figure 5:
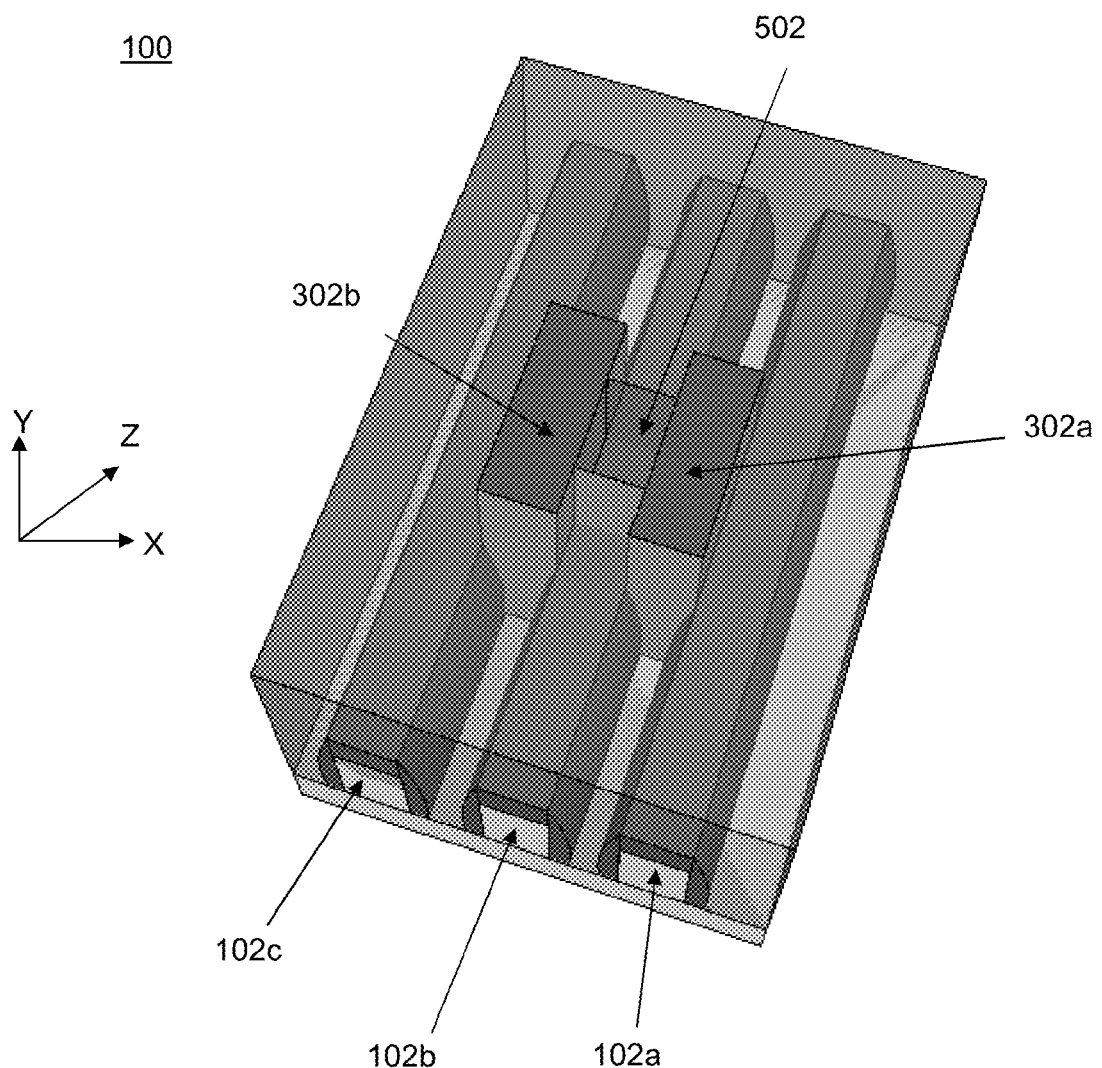
FIG. 5 depicts the device from FIG. 4 following the formation of a first gate contact between the first set of trenches, according to an embodiment of the present invention.

Referring to FIGS. 5 & 12, processor 100 is shown after operation S40 has been performed. In operation S40, first gate contact 502 is formed above gate structure 102b and between first trenches 302a and 302b. As shown in FIG. 5, first gate contact 502 is formed through first dielectric layer 202 and through the insulating layer that is on the top side of gate structure 102b. According to an embodiment of the present invention, one or more gate contacts can be formed above a gate structure when there are one or more pairs trenches formed along the gate structure. First gate contact 502 can be formed so that it is shorter (in the y direction) than first trenches 302a and 302b. First trenches 302a and 302b can also be wider (in the z direction) than first gate contact 502. This is ideal in preventing first gate contact 502 from shorting to the diffusion region. First gate contact 502 is protected from shorting to the diffusion regions below and neighboring gates by the insulating material that fills first trenches 302a and 302b. Also, to further prevent shorting to the diffusion or neighboring gate structures, first trenches 302a and 302b are longer (y direction) and wider (z direction) than first gate contact 502.

Figure 6:
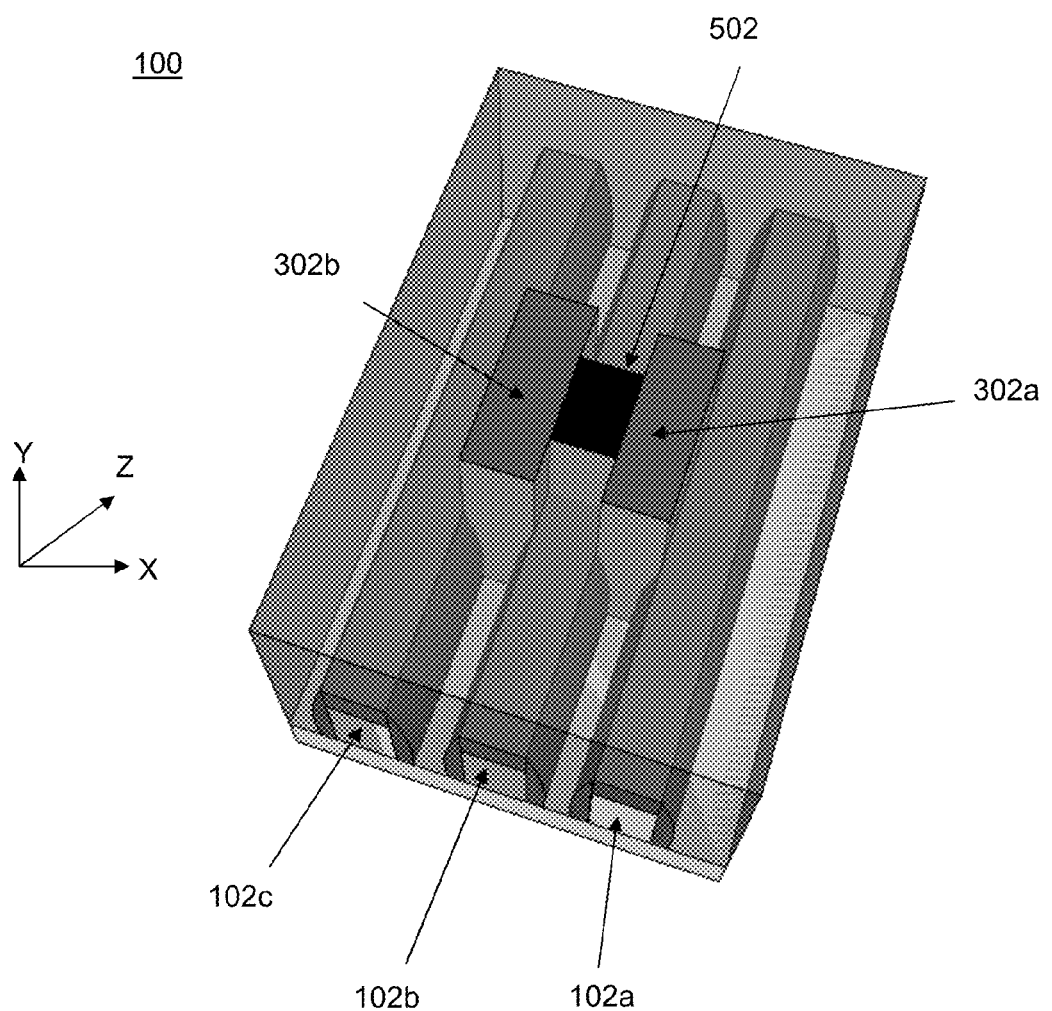
FIG. 6 depicts the device from FIG. 5 after the first gate contact is filled with a metal and planarized, according to an embodiment of the present invention.

Referring to FIGS. 6 & 12, processor 100 is depicted after the completion of operation S50. In operation S50, first gate contact 502 is filled with a first contact fill. The first contact fill can include a conductive material such as a metal, for example, titanium, titanium nitride, tungsten, aluminum, copper, platinum, tantalum, tantalum nitride, or any combination thereof. Standard contact processing can be used in order to deposit the first contact fill in first gate contact 502. After first gate contact 502 is filled with the first contact fill, first gate contact 502 is planarized in the same manner as first trenches 302a and 302b, described above.

Figure 7:
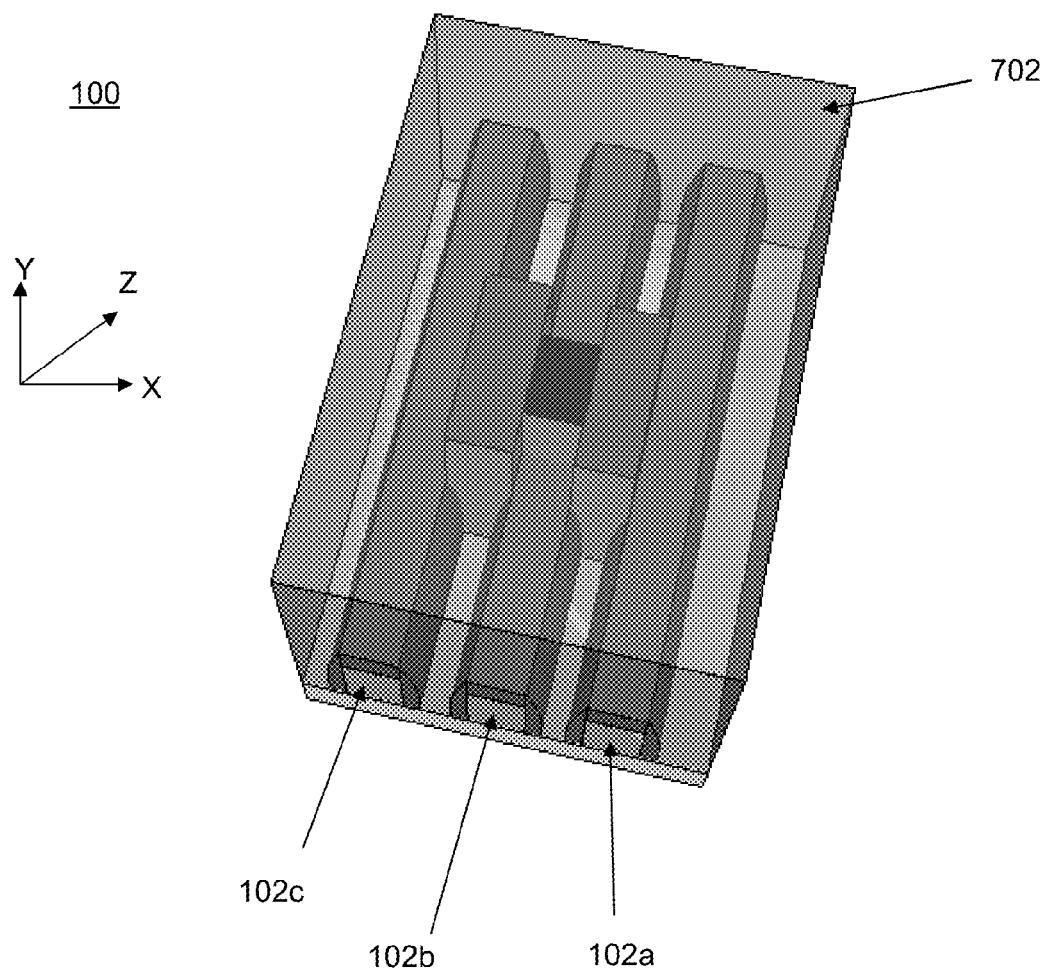
FIG. 7 depicts the device from FIG. 6 following the deposition of a second dielectric layer covering the device, according to an embodiment of the present invention.

Referring to FIGS. 7 & 12, processor 100 is shown after operation S60 has been performed. In operation S60, second dielectric layer 702 is deposited on processor 100. As illustrated in FIG. 7, second dielectric layer 702 covers first trenches 302a and 302b, first gate contact 502, and first dielectric layer 202. Second dielectric layer 702, just like first dielectric layer 202, can be a middle of the line (MOL) dielectric.

Figure 8:
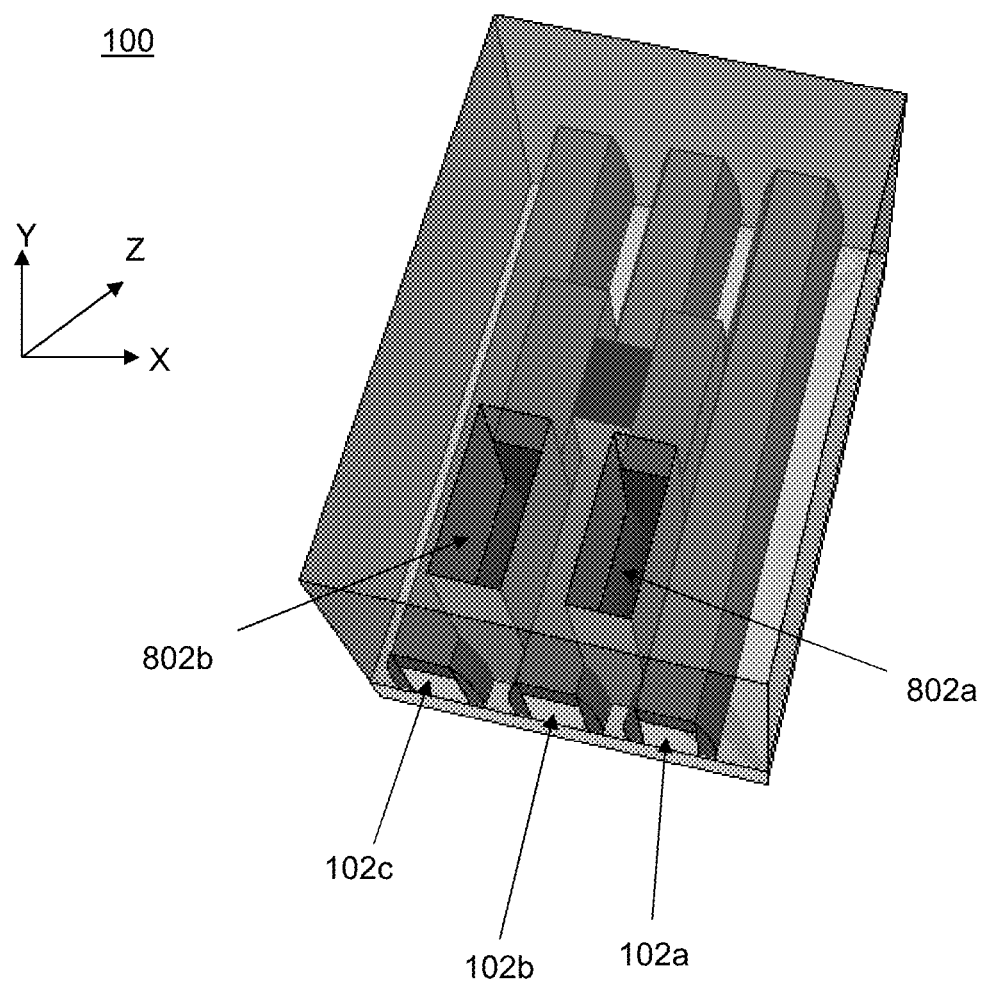
FIG. 8 depicts the device from FIG. 7 after a second set of trenches are formed through the first and second dielectric layers, according to an embodiment of the present invention.

Referring to FIGS. 8 & 12, processor 100 is shown following the completion of operation S70. In operation S70, second trenches 802a and 802b are formed through both first dielectric layer 202 and second dielectric layer 702. As depicted in FIG. 8, second trenches 802a and 802b are formed between gate structures 102a, 102b, and 102c. Second trench 802a exposes a portion of diffusion region 104 between gate structures 102a and 102b and second trench 802b exposes a portion of diffusion region 104 between gate structures 102b and 102c. Second trenches 802a and 802b are formed at different locations along the width (z-direction) of gate structure 102b than first trenches 302a and 302b. Following the formation of the trenches, silicide is formed on the exposed portions of diffusion region 104 at the bottom of the trenches. Second trenches 802a and 802b can be contiguous with first trenches 302a and 302b, and second trenches 802a and 802b must not contact first gate contact 502. FIG. 8 depicts second trench 802a between gate structures 102a and 102b, and second trench 802b between gate structures 102b and 102c. Second trenches 802a and 802b are depicted as being formed at the endpoint of gate structures 102a, 102b, and 102c. However, the present invention is not limited to this design. Second trenches 802a and 802b can be formed at multiple positions along the width (z-direction) of the gate structures. For example, a pair of first trenches can be formed at the midpoint of the gate structure and two pair of second trenches can be formed at the ends of the gate structure. As another example, two pairs of first trenches can be formed at the ends of the gate structure and a pair of second trenches can be formed at the midpoint of the gate structure. The designer has the freedom to choose the arrangement of the processor and the arrangement of the first and second trenches.

Figure 9:
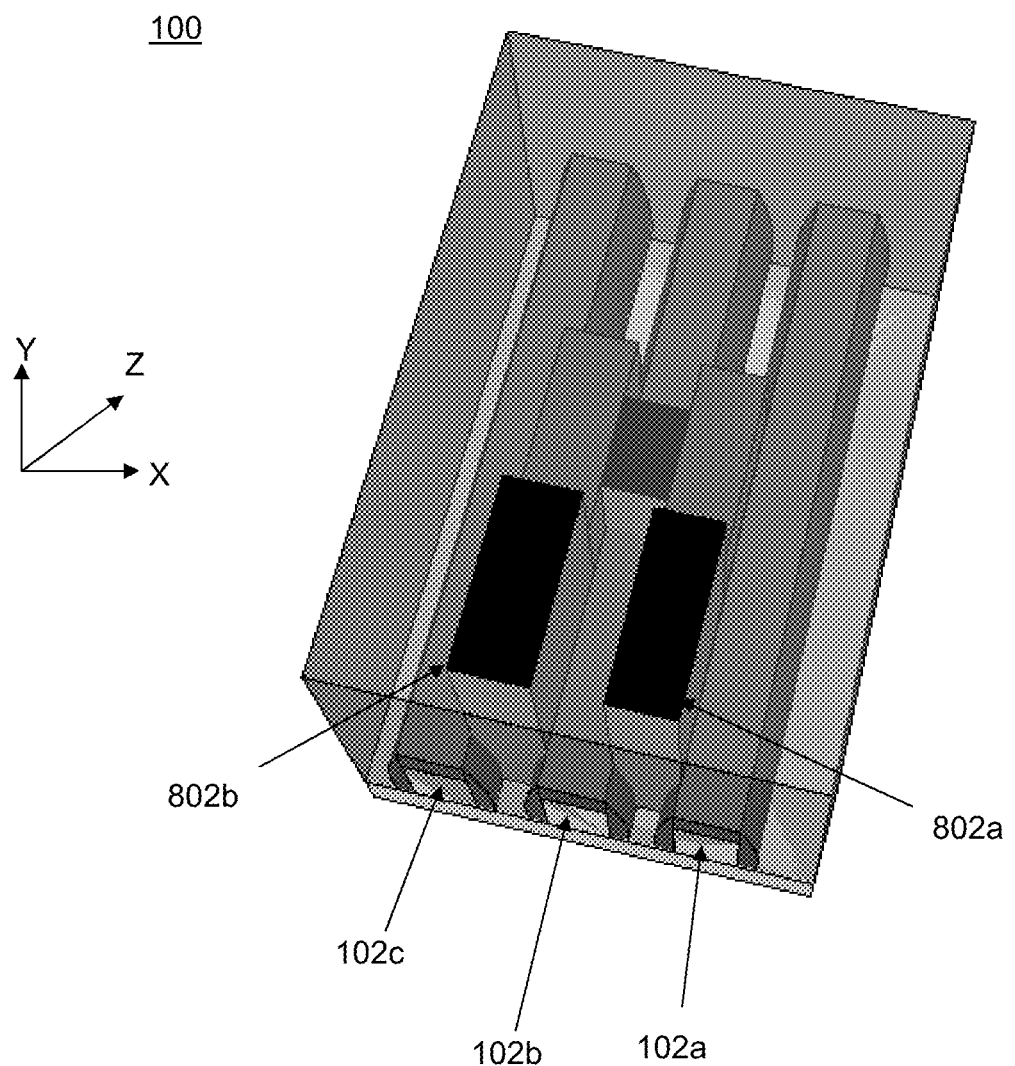
FIG. 9 depicts the device from FIG. 8 after the second set of trenches are filled with a conductive material and planarized, according to an embodiment of the present invention.

Referring to FIGS. 9 & 12, processor 100 is shown following the completion of operation S80. In operation S80, second trenches 802a and 802b are filled with a conductive material. The conductive material used to fill the trenches can be metal, such as titanium, titanium nitride, tungsten, aluminum, copper, platinum, tantalum, tantalum nitride, or any combination thereof. After the trenches are filled, an etch back or polish of the trenches is performed in order to planarize processor 100. The process performed in operations S70 and S80 is a standard trench contact module and is know by those skilled in the art. The prior trench contact module from operations S20 and S30 is similar to the trench contact module performed here, except an insulating material was used as a fill instead of the conductive material used in here.

Figure 10:
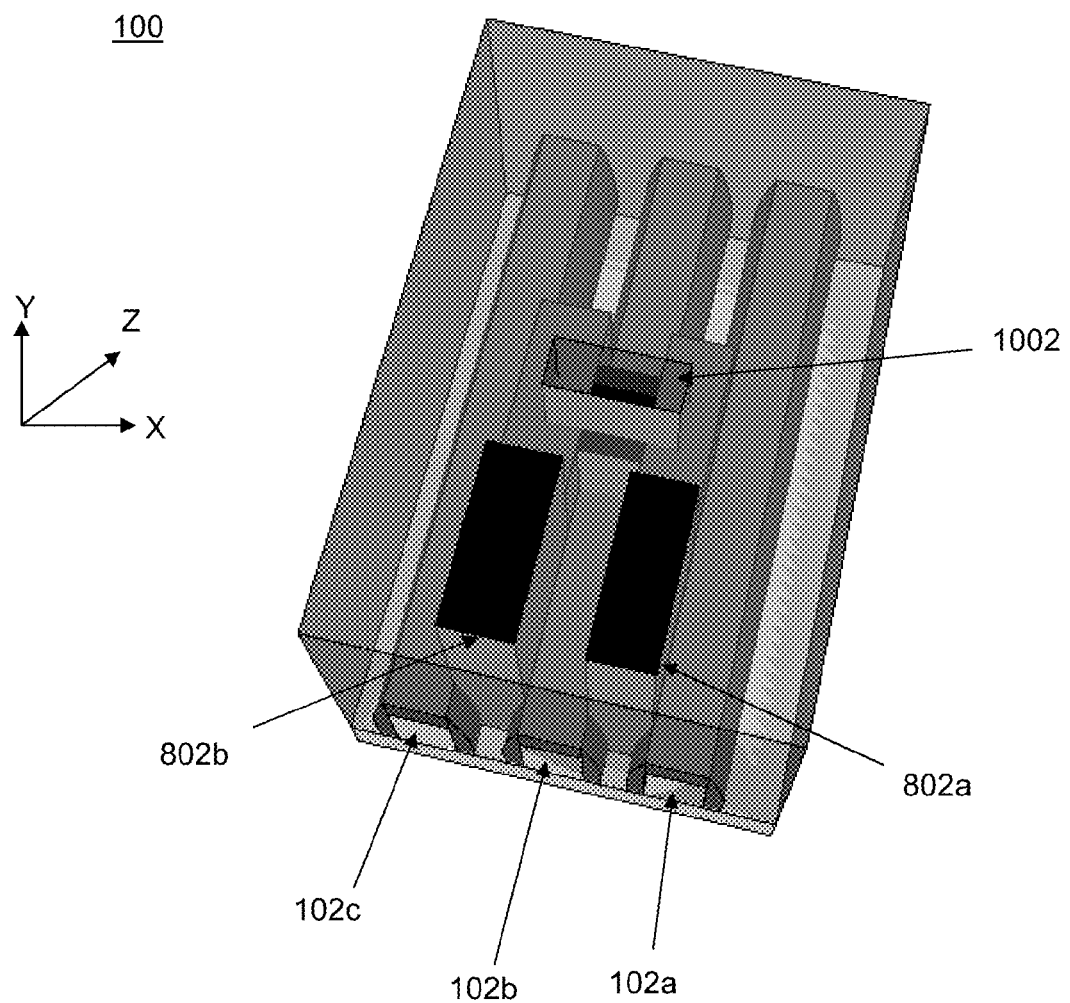
FIG. 10 depicts the device from FIG. 9 following the formation of a second gate contact, according to an embodiment of the present invention.

Referring to FIGS. 10 & 12, processor 100 is depicted after operation S90 has been performed. In operation S90, second gate contact 1002 is formed above first gate contact 502. As illustrated in FIG. 10, second gate contact 1002 is a contact via formed through second dielectric layer 702 to contact first gate contact 502. However, second gate contact 1002 does not contact second trenches 802a and 802b. First trenches 302a and 302b help to prevent second gate contact 1002 from shorting to the diffusion region, and they give the designer tolerance when forming second gate contact 1002. First trenches 302a and 302b prevent shorting to the diffusion region and neighboring gate structures, and thus allows the designer more overlay tolerance.

Figure 11:
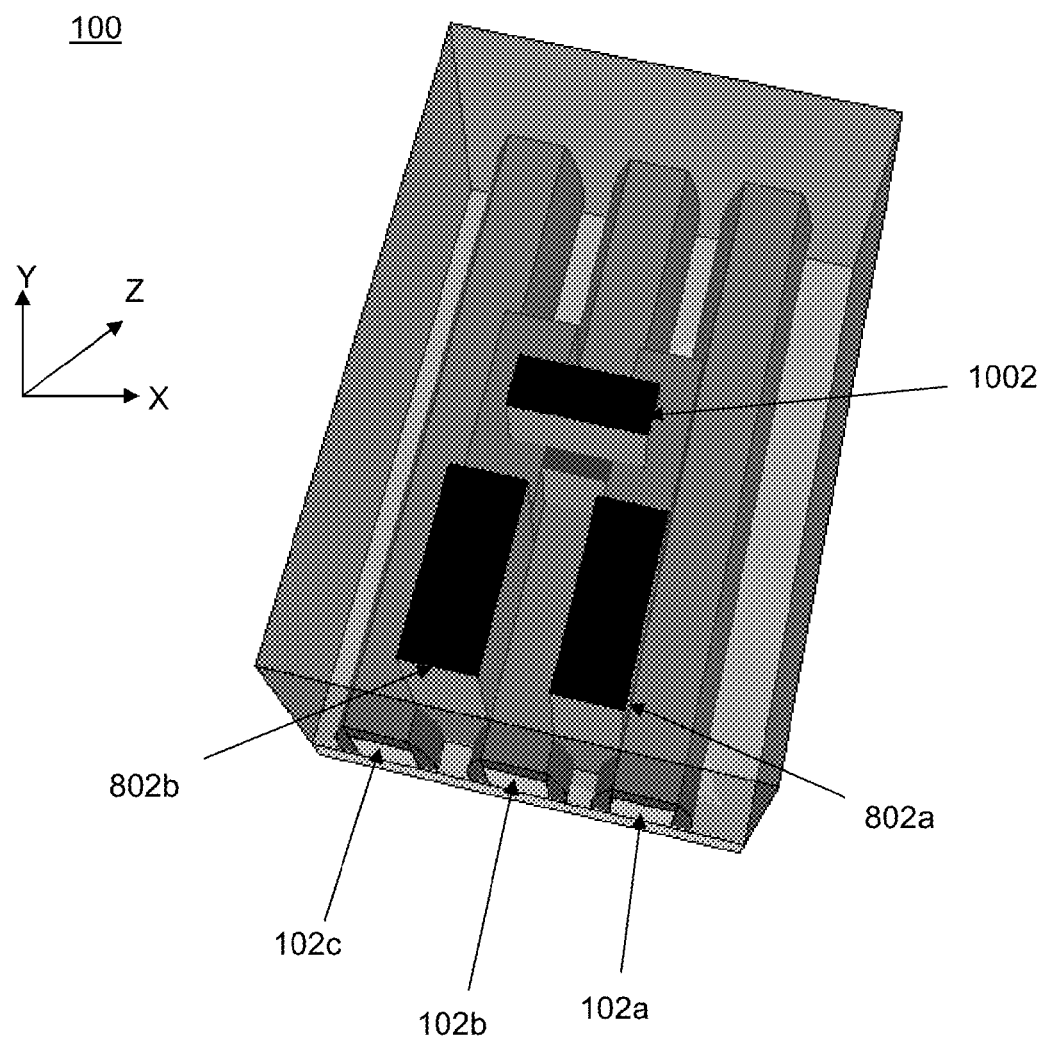
FIG. 11 depicts the device from FIG. 10 after the second gate contact is filled with a metal and planarized, according to an embodiment of the present invention.

Referring to FIGS. 11 & 12, processor 100 is shown following the completion of operation S100. In operation S100, second gate contact 1002 is filled with a second contact fill. The second contact fill is a metal and can include, for example, titanium, titanium nitride, tungsten, aluminum, copper, platinum, tantalum, tantalum nitride, or any combination thereof. Standard contact processing can be used in order to deposit the second contact fill in second gate contact 1002. After second gate contact 1002 is filled with the second contact fill, second gate contact 1002 is planarized.

The resulting structure after the completion of operations in FIG. 12 includes a semiconductor device with self-aligned gate contacts over an active area. First trenches 302a and 302b are formed through first dielectric layer 202 and between gate structures 102a, 102b, and 102c. First gate contact 502 contacts gate structure 102b and is formed between first trenches 302a and 302b. Second trenches 802a and 802b are formed through first dielectric layer 202 and second dielectric layer 702. Second gate contact 1002 is formed so that it contacts first gate contact 502 but does not contact second trenches 802a and 802b. The design of the device prevents the gate contacts from shorting to diffusion region 104 and neighboring gate structures 102a and 102c due to an insulating material that fills first trenches 302a and 302b. The overall design of the device allows for greater flexibility and gives the designer of the FET extra overlay tolerance.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device comprising:
    a first dielectric layer formed over a semiconductor device having a plurality of gate structures formed on a plurality of active regions and a plurality of diffusion regions formed alongside the plurality of active regions, wherein the plurality of gate structures have a top, a bottom, and two sides, and are encapsulated by an insulating layer on the top and two sides;
    a plurality of first trenches formed at a plurality of first locations through the first dielectric layer to a first portion of the plurality of diffusion regions, wherein silicide is formed on the first portion of the plurality of diffusion regions and the plurality of first trenches are filled with an insulating material, wherein the insulating material is different from a material of the first dielectric layer;
    at least one first gate contact formed through the first dielectric layer and the insulating layer on the top at least one of the plurality of gate structures, wherein the at least one first gate contact is filled with a first contact fill and formed between the plurality of first trenches;
    a second dielectric layer deposited on the first dielectric layer, the plurality of first filled trenches, and the at least one filled gate contact;
    a plurality of second trenches formed at a plurality of second locations through the first and second dielectric layers to a second portion of the plurality of diffusion regions, wherein silicide is formed on the second portion of the plurality of diffusion regions and the plurality of second trenches are filled with a conductive material, wherein the plurality of second trenches filled with the conductive material and the plurality of the first trenches filled with the insulating material are at non-overlapping locations; and
    at least one second gate contact through the second dielectric layer, wherein the at least one second gate contact is filled with a second contact fill and is in contact with the at least one first gate contact.

2. The device according to claim 1, wherein the first and second dielectric layers comprise a first middle of the line dielectric.

3. The device according to claim 1, wherein the insulating material is a second middle of the line dielectric.

4. The device according to claim 3, wherein the second middle of the line dielectric is silicon nitride.

5. The device according to claim 1, wherein the conductive material, the first contact fill, and the second contact fill is a metal.

6. The device according to claim 5, wherein the metal is selected from a group consisting of: titanium, titanium nitride, tungsten, aluminum, copper, platinum, tantalum, tantalum nitride, and combinations thereof.

7. The device according to claim 1, wherein the plurality of first trenches extend a distance through the first dielectric layer and the at least one first gate contact extends a distance through the first dielectric layer.

8. The device according to claim 7, wherein the distance of the at least one first gate contact through the first dielectric layer is less than the distance of the plurality of first trenches through the first dielectric layer.

9. The device according to claim 1, wherein the plurality of gate structures have a pitch of 50-100 nanometers.

10. The device according to claim 1, wherein the first dielectric layer includes $SiO_2$.

11. The device according to claim 1, wherein the first dielectric layer includes SiCOH.

12. The device according to claim 1, wherein the plurality of first trenches formed at the plurality of first locations correspond to a midpoint of the plurality of gate structures.

13. The device according to claim 1, wherein the insulating material includes silicon nitride.

14. The device according to claim 1, wherein the at least one first gate contact is shorter than the plurality of first trenches.

15. The device according to claim 1, wherein the plurality of second trenches are at an endpoint of the plurality of gate structures.

16. The device according to claim 1, wherein the plurality of second trenches are at a midpoint of the plurality of gate structures; and
    wherein the plurality of first trenches are at an endpoint of the plurality of gate structures.

17. The device according to claim 1, wherein the at least one second gate contact does not touch the plurality of second trenches.

18. The device according to claim 1, wherein the at least one second gate contact are separated from the plurality of second trenches.

19. The device according to claim 18, wherein a part of the plurality of first trenches separates the at least on second gate from the plurality of second trenches.

20. A semiconductor device comprising:
    a first dielectric layer formed over a semiconductor device, the semiconductor device having a plurality of gate structures formed on a plurality of active regions and a plurality of diffusion regions formed alongside the plurality of active regions, wherein the plurality of gate structures are encapsulated on a top and two sides by an insulating layer;
    first filled trenches formed at first locations through the first dielectric layer and at a first portion of the plurality of diffusion regions, wherein silicide is formed on the first portion of the plurality of diffusion regions and the first filled trenches are filled with an insulating material, wherein the insulating material is different from a material of the first dielectric layer;
    at least one first gate contact formed through the first dielectric layer and the insulating layer on the top at least one of the plurality of gate structures, wherein the at least one first gate contact is formed between the first filled trenches;
    a second dielectric layer deposited on the first dielectric layer, the first filled trenches, and the at least one first gate contact;
    second filled trenches formed at second locations through the first and second dielectric layers and at a second portion of the plurality of diffusion regions, wherein silicide is formed on the second portion of the plurality of diffusion regions and the second trenches are filled with a conductive material, wherein the second filled trenches filled with the conductive material and the first filled trenches filled with the insulating material are at non-overlapping locations; and
    at least one second gate contact through the second dielectric layer, the at least one second gate contact in contact with the at least one first gate contact.

* * * * *